US011133424B2

(12) United States Patent
Mazzillo et al.

(10) Patent No.: US 11,133,424 B2
(45) Date of Patent: Sep. 28, 2021

(54) LOW POWER OPTICAL SENSOR FOR CONSUMER, INDUSTRIAL, AND AUTOMOTIVE APPLICATIONS

(71) Applicant: STMicroelectronics S.r.l., Agrate Brianza (IT)

(72) Inventors: Massimo Cataldo Mazzillo, Corato (IT); Pietro Paolo Barbarino, Belpasso (IT); Domenico Pierpaolo Mello, Catania (IT); Antonella Sciuto, S. Giovanni la Punta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 16/509,040

(22) Filed: Jul. 11, 2019

(65) Prior Publication Data

US 2020/0028001 A1    Jan. 23, 2020

(30) Foreign Application Priority Data

Jul. 17, 2018    (IT) .................. 102018000007263

(51) Int. Cl.
*H01L 31/0216* (2014.01)
*H01L 31/107* (2006.01)
(Continued)

(52) U.S. Cl.
CPC ...... *H01L 31/02162* (2013.01); *H01L 31/107* (2013.01); *H01L 31/16* (2013.01); *H01L 33/38* (2013.01)

(58) Field of Classification Search
CPC . H01L 31/02162; H01L 31/107; H01L 31/16; H01L 33/38
See application file for complete search history.

(56) References Cited

U.S. PATENT DOCUMENTS 5,416,030 A * 5/1995 Elkind ............... H01L 31/1032
148/DIG. 135
6,279,100 B1    10/2001 Kumar et al.
(Continued)

FOREIGN PATENT DOCUMENTS

EP    1 383 177 A1    1/2004

OTHER PUBLICATIONS

Aharonovich et al., "Solid-state single-photon emitters," *Nature Photonics* 10:631-641, Oct. 2016.
(Continued)

*Primary Examiner* — Nathan W Ha
(74) *Attorney, Agent, or Firm* — Seed IP Law Group LLP

(57) ABSTRACT

An optical sensor includes a light-emitter device formed in a body of solid-state material with wide band gap having a surface. The light-emitter device includes a cathode region having a first conductivity type and an anode region having a second conductivity type. The anode region extends into the cathode region from the surface of the body. The anode region and the cathode region define a junction, and the cathode region has, near the junction, a peak defectiveness area accommodating vacancies in the crystalline structure due to non-bound ions or atoms of Group IV or VIII of the periodic table, which may include carbon, silicon, helium, argon, or neon. The vacancies are at a higher concentration with respect to mean values of vacancies in the anode region and in the cathode region. For example, the vacancies in the peak defectiveness area have a concentration of at least $10^{13}$ atoms/cm$^{-3}$.

24 Claims, 9 Drawing Sheets

(51) Int. Cl.
*H01L 31/16* (2006.01)
*H01L 33/38* (2010.01)

(56) References Cited

U.S. PATENT DOCUMENTS

| | | | |
|---|---|---|---|
| 7,019,333 B1 | 3/2006 | Shields et al. | |
| 2007/0076446 A1* | 4/2007 | Shiga | H02M 3/3376 363/17 |
| 2014/0339398 A1 | 11/2014 | Mazzillo et al. | |
| 2014/0357026 A1* | 12/2014 | Kobayashi | H01L 21/26506 438/135 |
| 2015/0050798 A1* | 2/2015 | Kobayashi | H01L 29/36 438/475 |
| 2015/0270128 A1* | 9/2015 | Nishio | H01L 21/0262 257/77 |
| 2015/0311279 A1* | 10/2015 | Onozawa | H01L 29/0615 257/139 |
| 2016/0005605 A1* | 1/2016 | Nishio | H01L 29/6606 257/77 |
| 2016/0087036 A1* | 3/2016 | Shimizu | H01L 21/02554 |
| 2016/0099385 A1 | 4/2016 | Kim et al. | |
| 2017/0070029 A1 | 3/2017 | Moeneclaey et al. | |
| 2018/0138299 A1* | 5/2018 | Naito | H01L 29/4238 |

OTHER PUBLICATIONS

Degen et al., "Quantum sensing," *Reviews of Modern Physics*, vol. 89, Jul.-Sep. 2017, 39 pages.
Fuchs et al., "Silicon carbide light-emitting diode as a prospective room temperature source for single photons," *Scientific Reports*, 3:1637, published Apr. 10, 2013, 4 pages.
Khramtsov et al., "Enhancing the brightness of electrically driven single-photon sources using color centers in silicon carbide," *Nature Partner Journals | Quantum Information*, published Feb. 21, 2018, 8 pages.
Lohrmann et al., "Single-photon emitting diode in silicon carbide," *Nature Communications*, published Jul. 23, 2015, 7 pages.
Wang et al., "Efficient Generation of an Array of Single Silicon-Vacancy Defects in Silicon Carbide," *Physical Review Applied 7*, 064021, 2017, 6 pages.
Zhu et al., "Vacancy-type defects in 6H-silicon carbide induced by He-implantation: a positron annihilation spectroscopy approach," *Journal of Physics D: Applied Physics 14*, 195304, 2008, 7 pages.

* cited by examiner

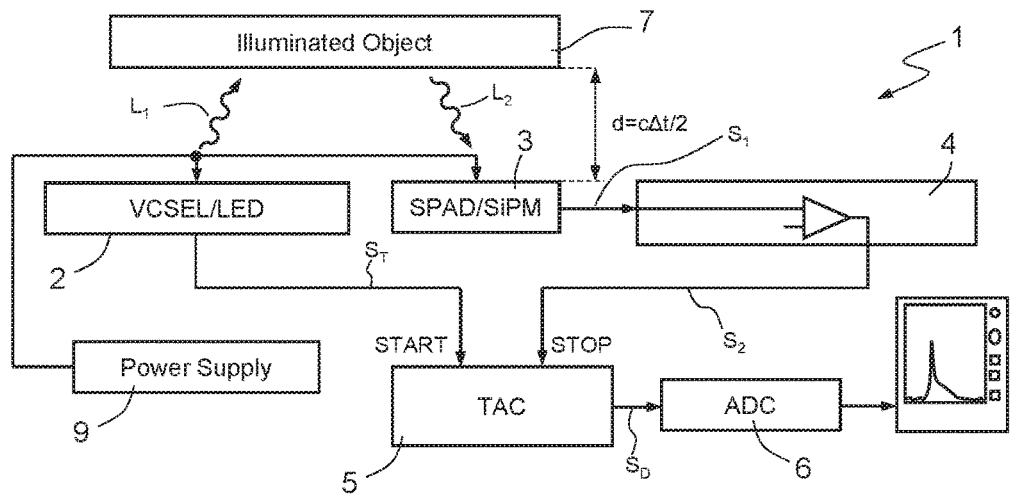
Fig.1
(Related Art)
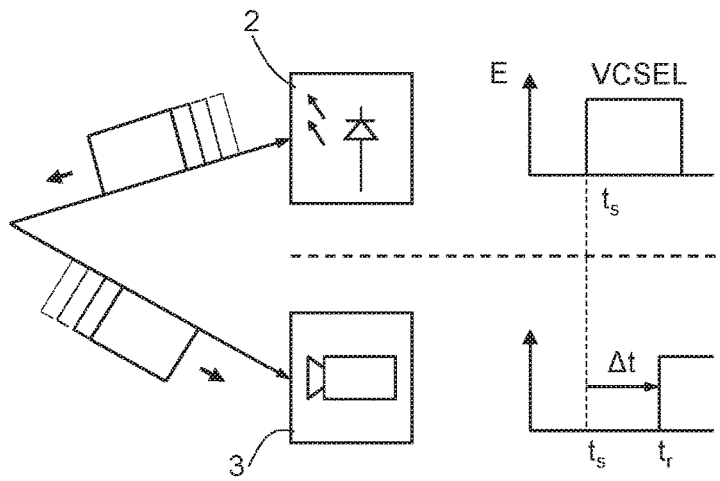
Fig.2
(Related Art)
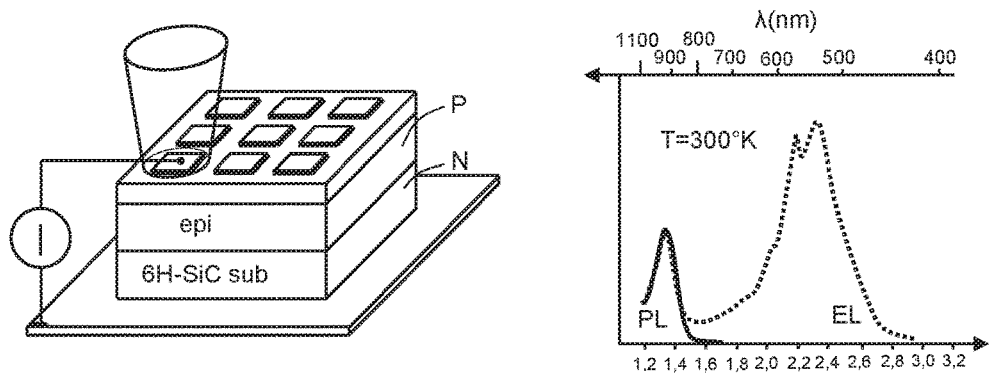
Fig.3
(Related Art)
Fig.4
(Related Art)

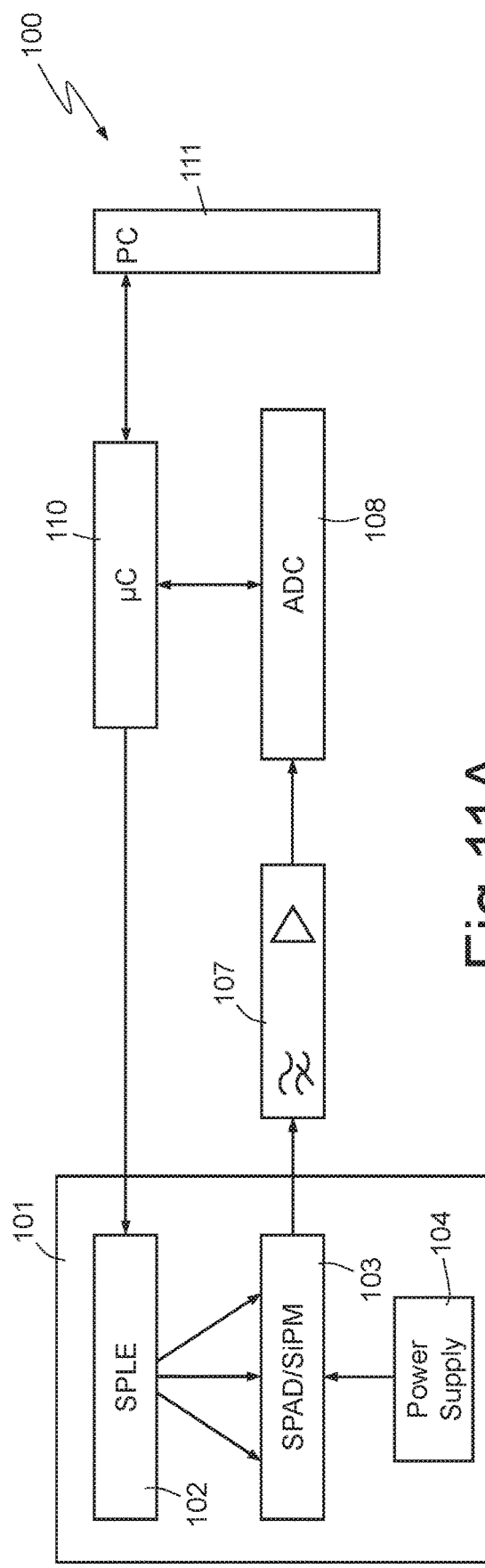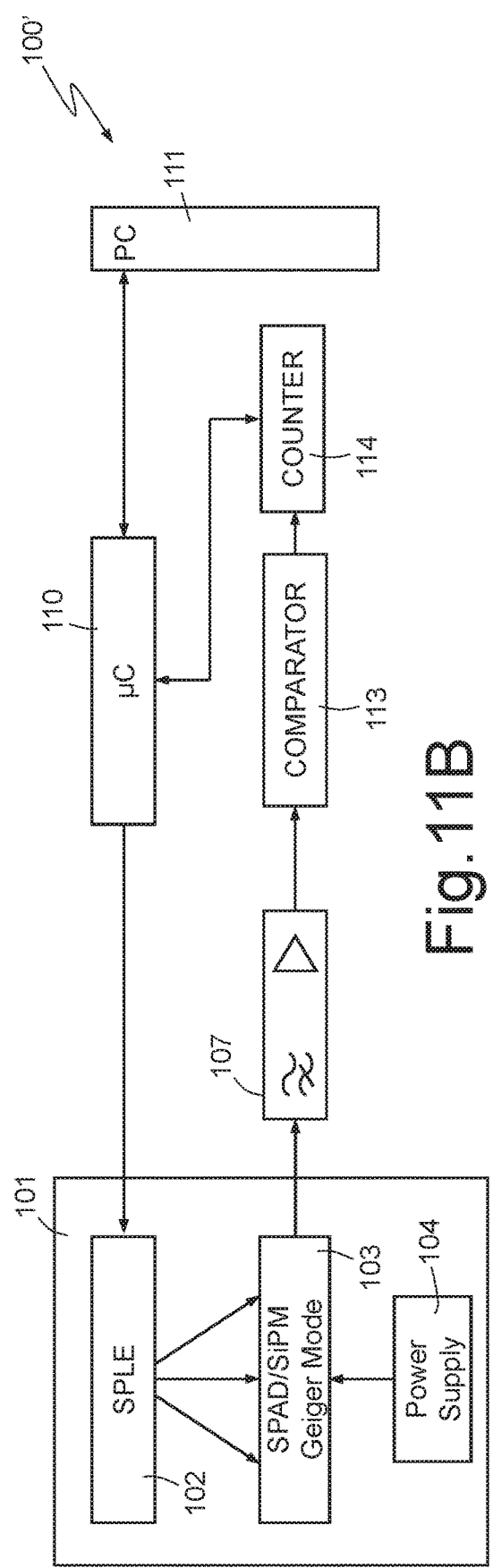

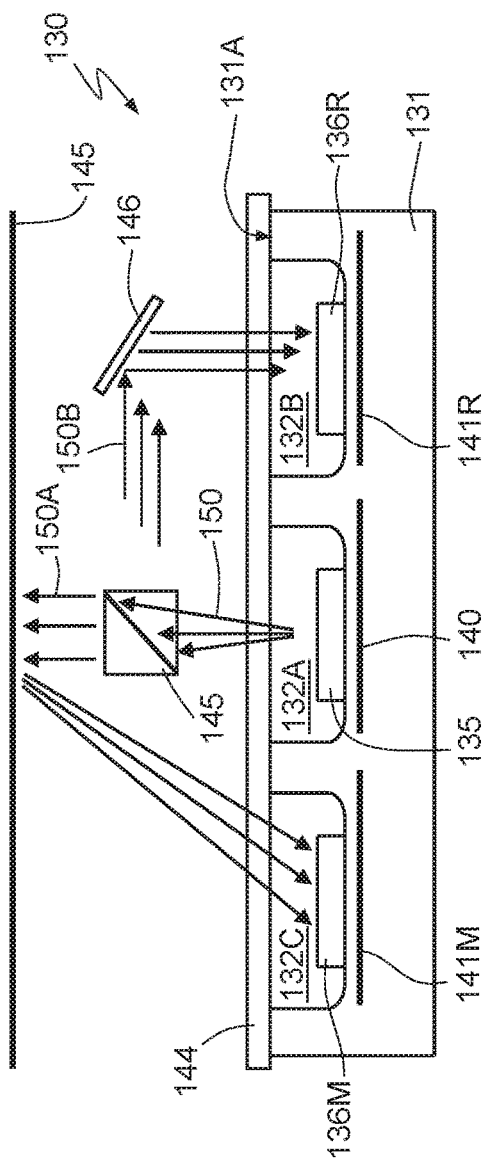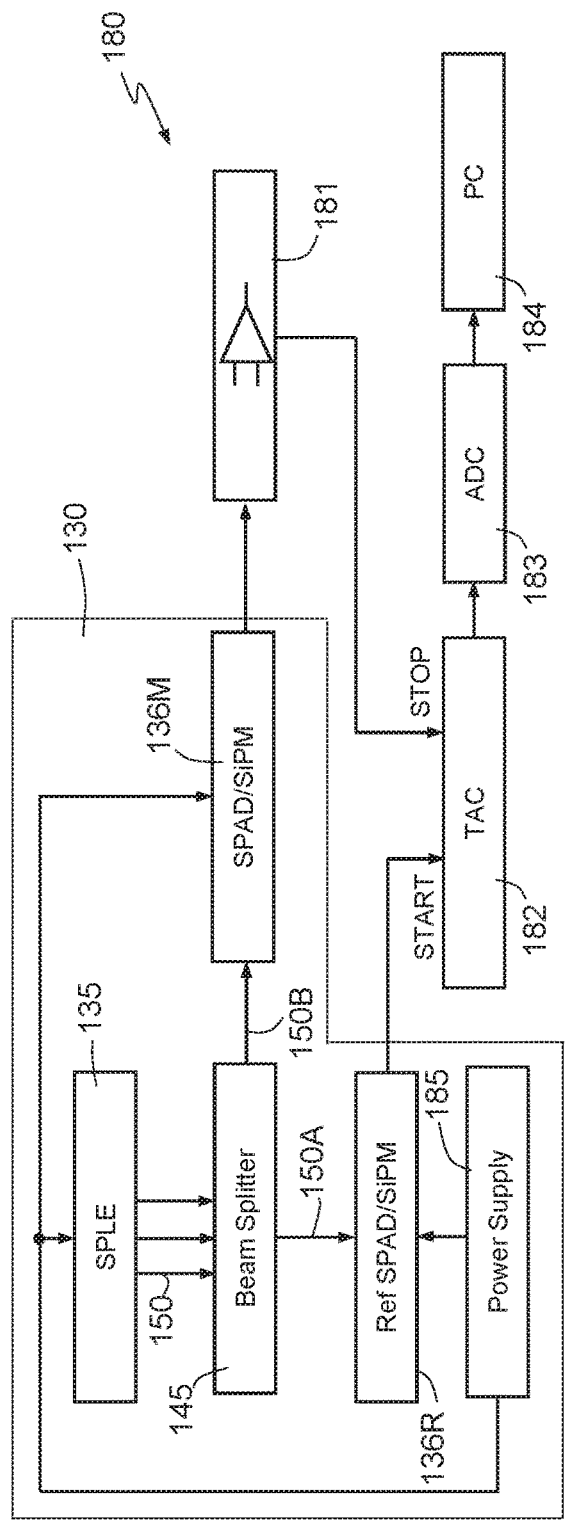

LOW POWER OPTICAL SENSOR FOR CONSUMER, INDUSTRIAL, AND AUTOMOTIVE APPLICATIONS

BACKGROUND

Technical Field

The present disclosure relates to a low power optical sensor for consumer, industrial, and automotive applications.

Description of the Related Art

As is known, photonic technologies are becoming increasingly widespread in everyday life. After decades of fast progress, light sources, in particular lasers and light-emitting diodes, have become having high performance, but low cost and high reliability components, at the basis, for example, of Internet operation and urban lighting.

A new frontier of research is the development of non-classic light sources, such as low power sources able to produce photon flows with controllable emission rate, fast decay (few nanoseconds), and a clearly defined spectral bandwidth. In particular, robust and inexpensive light sources able to emit single photons on demand are at the center of many highly demanding optical technologies.

The possibility of providing devices able of emitting single photons has been demonstrated for various systems, including atoms, ions, molecules, and quantum dots (QD), many of which operate at cryogenic temperatures and in high inhomogeneity conditions and their use on a wide scale is thus impracticable.

For example, single-photon sources have been devised, that are electrically driven in the range of visible light and use nitrogen vacancies (NV) centers in diamond, but the compatibility of these sources with the current production processes of integrated circuits is not obvious.

The availability of a device based upon single-photon sources is on the other hand desirable, since these sources have particular and advantageous space-time and chromaticity characteristics, thanks to their capacity of emitting few photons (down to a single photon) at each burst, with a short lifetime (of the order of nanoseconds), appreciable radiating power even in presence of low electrical and/or optical excitation, low power consumption, narrow emission band at short wavelengths (including an emission band in the infrared) and operation even at room temperature.

Moreover, applications that could benefit from the presence of single-photon source devices are increasingly demanding, such as low power proximity sensors. Among them, in terms of importance, consumer, industrial, automotive, and telecommunication applications may be mentioned. In particular, telecommunication networks increasingly exploit complex encryption techniques, where it would be useful to use high-speed optical devices having transmission/reception windows in narrow and precise frequency ranges. Other foreseeable applications are industrial metrological systems, and systems for automation and quality control, imaging systems based upon chemiluminescence and photoluminescence, for example for medical instrumentation for diagnostic investigations, or portable diagnostic devices, which can be used directly by individual patients, such as for heart beat, oxygenation, etc., sensors.

Currently, however, the proposed solutions do not completely satisfy the desired attributes of precision, rapidity, low cost, and reliability.

For example, FIG. 1 shows the structure of a known proximity sensor, which measures the time taken by light to follow a preset path (also known as "time-of-flight sensor"), which can be used in a wide range of applications, for example for reconstruction of three-dimensional surfaces.

The proximity sensor of FIG. 1, designated as a whole by 1, comprises a light emitter 2, for example a VCSEL (Vertical-Cavity Surface-Emitting Laser) or an AlGaAs-based LED that emits a pulsed light radiation L1 (for example, a series of light pulses of very short duration, shorter than one nanosecond, with a wavelength of 940 nm); a light receiver 3, for instance an avalanche photodiode operating in Geiger mode, also known as SPAD (Single-Photon Avalanche Diode, for example as described in the US patent application 2014/0339398) or a SiPM (Silicon PhotoMultiplier), formed by an array of SPADs, and outputting a sensing signal s1; a comparator 4, comparing the sensing signal s1 generated by the light receiver 3 with a threshold and outputting a stop signal s2; a time-to-amplitude converter (TAC) 5, receiving a trigger signal $s_T$ from the light emitter 2 and the stop signal s2; and an analog-to-digital converter 6, connected to the output of the time-to-amplitude converter 5. A power supply 9 supplies the blocks of the proximity sensor 1.

In the proximity sensor 1 (see also the simplified diagram of FIG. 2), the light emitter 2 emits the light radiation L1 towards an object 7, the distance whereof is to be determined, and simultaneously emits the trigger signal $s_T$. The light radiation reflected by the object 7 (designated by L2) is detected by the light receiver 3, which causes generation of the stop signal s2 by the comparator 4 (for example, a CFD—Constant-Fraction Discriminator). The time-to-amplitude converter 5 (for example, a counter) generates a distance signal $s_D$, which, after digitization, can be displayed on a screen 8.

The above diagram is based on the use of a driver circuit for driving the light emitter 2 implemented in CMOS technology and such as to enable the light emitter 2 to generate light in short times, with high energy and sufficient precision. However, the above circuit is somewhat complex and has to be produced separately (it cannot be integrated in the same chip as the light emitter 2) so that the proximity sensor 1 is complex and costly.

It is thus desirable to provide a proximity sensor that has reduced complexity and thus has a simpler structure and lower costs.

In the field of light-emitting devices, SiC-based photodiodes operating in forward-biasing condition have been proposed (see, for example, FIG. 3). These diodes, operating in LED mode, emit light by electroluminescence and are characterized by an emission peak at a wavelength of approximately 480 nm (thus, in the range of blue light). Recent studies (see, for example, "Silicon carbide light-emitting diode as a prospective room temperature source for single photons" by F. Fuchs et al., Errore. L'origine riferimento non è stata trovata, published on-line on Apr. 10, 2013) show that this type of photodiodes can also have a non-negligible peak at approximately 900 nm (thus, in the infrared range, see FIG. 4, where EL is the electroluminescence spectrum of an SiC—Silicon Carbide—LED, and PL is the photoluminescence spectrum of an SiC reference sample, measured at room temperature). This emission has been attributed to silicon vacancies, obtainable by high energy electron irradiation. In particular, in the irradiated devices, it has been noted that the vacancies determine a level transition from the valence band to the conduction band and the electrons, after excitation to the higher forbidden level, fall back into the lower level in a few nanoseconds, emitting light in the near infrared (NIR) with single-photon emission characteristics.

BRIEF SUMMARY

In various embodiments, the present disclosure provides an improved optical sensor that exploits the potential of SPLE devices.

In one embodiment, the present disclosure provides an optical sensor that includes a body of solid state material with a band gap greater than or equal to 2.3 eV, and a light-emitter device in the body. The light-emitter device includes a cathode region having a first conductivity type, and an anode region having a second conductivity type. The anode region extends into the cathode region from a surface of the body, and the anode region and the cathode region define a junction. The cathode region has, adjacent to the junction, a peak defectiveness area housing vacancies in a crystalline structure due to non-bound ions or atoms of Group IV or VIII of the periodic table.

In an embodiment, the present disclosure provides an optical proximity sensor that includes a body of solid-state material with a band gap greater than or equal to 2.3 eV, a light-emitter device in the body, a light-receiver element, and a current-pulse counting stage. The light-emitter device includes a cathode region having a first conductivity type, and an anode region having a second conductivity type. The anode region extends into the cathode region from a surface of the body, and the anode region and the cathode region define a junction. The cathode region has, adjacent to the junction, a peak defectiveness area housing vacancies in a crystalline structure due to non-bound ions or atoms of Group IV or VIII of the periodic table. The light-emitter device is a single-photon light-emitter element configured to emit a single-photon emission radiation having a wavelength within a first wavelength range. The light-receiver element is configured to operate in avalanche operating mode or in photomultiplier operating mode and is arranged, in use, to receive, directly or via reflection, radiation emitted from the light-emitter device. The current-pulse counting stage is configured to count current pulses supplied by the light-receiver element.

In an embodiment, the present disclosure provides a method for manufacturing an optical sensor having a light-emitter device. The method includes: receiving a body of solid-state material with a band gap greater than or equal to 2.3 eV, the body including a cathode region having a first conductivity type; forming an anode region of a second conductivity type extending within the cathode region from a surface of the body by doping a portion of the cathode region with dopant ion species of the second conductivity type, the anode region defining a junction with the cathode region; and forming a peak defectiveness area by implanting non-bound ions or atoms of Group IV or Group VIII of the periodic table within the cathode region and through the anode region, the peak defectiveness area having vacancies in a crystalline structure in the cathode region adjacent to the junction.

BRIEF DESCRIPTION OF THE SEVERAL VIEWS OF THE DRAWINGS

For a better understanding of the present disclosure, embodiments thereof are now described, purely by way of non-limiting example, with reference to the attached drawings, wherein:

FIG. 1 is a block diagram of a known proximity sensor;

FIG. 2 shows the operating mode of some components of the sensor of FIG. 1;

FIG. 3 is a perspective view of the embodiment of a component of the sensor of FIG. 1;

FIG. 4 shows the emission curves of the component of FIG. 3;

FIGS. 11A and 11B are block diagrams of two possible embodiments of a proximity sensor using the optical sensor according to one of the configurations of FIGS. 7-10;

FIG. 12 shows another configuration of the present optical sensor forming an optical sensor in a time-of-flight measuring configuration;

FIG. 13 shows a block diagram of an application of the optical sensor of FIG. 12;

DETAILED DESCRIPTION

Figure 5:
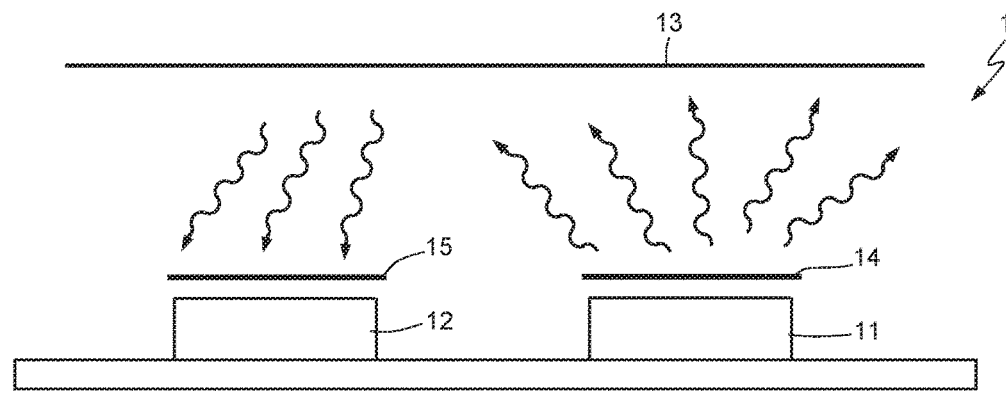
FIG. 5 shows the configuration of a testing system made by the present applicant.
Figures 6A, 6B:
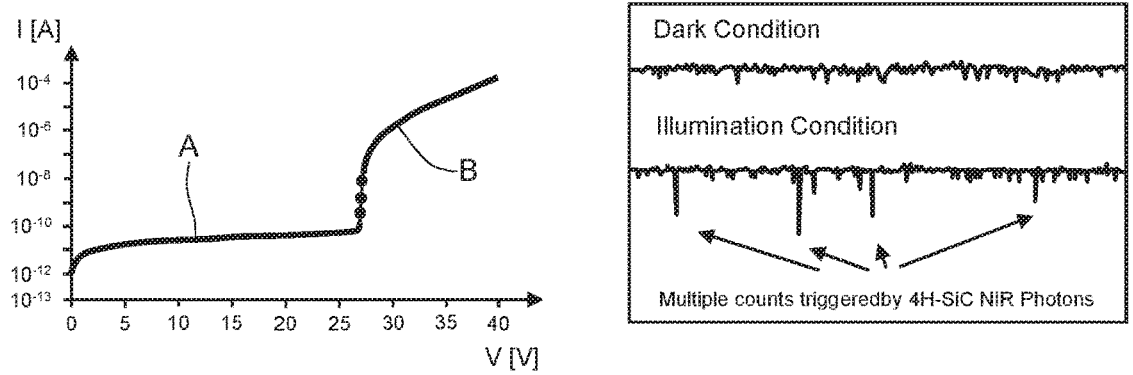
FIG. 6A shows the current-voltage characteristic of the component 3 of FIG. 1.
FIG. 6B shows the sequence of Geiger current pulses of the component 3 of FIG. 1.

FIG. 5 shows a testing system 10 made by the Applicant. The testing system 10 comprises an emitter element 11 formed by an emitter device of an SPLE (Single-Photon Light Emitter) type and a detector element 12 formed by a silicon photomultiplier, operating in the single-photon detection condition and receiving a fraction of light emitted by the emitter element 11 and reflected by a reflecting target which may be any reflective structure and in some embodiments may be, for example, a silicon wafer 13 of a reflecting type. A first filter 14 (formed by a 900-nm band-pass filter) is arranged on the emitter element 11, and a second filter 15 (formed by a long-pass filter that passes radiation in the near infrared—NIR filter) is arranged on the detector element 12. FIG. 6A shows the current-voltage characteristic of the detector 12. As may be noted, in the reverse-biasing condition, after operating in low-current linear mode (area A of the curve of FIG. 6A), in the Geiger-mode operating area (area B of the curve of FIG. 6A), there is a fast current increase, associated to light emission, but of a value that is still low and visible only in the Geiger-mode operating condition. This emission is highlighted in the traces of FIG. 6B, representing the sequence of Geiger current pulses in dark condition (top) and in presence of lighting (bottom). In particular, these measures have been carried out at room temperature by forward biasing the emitter at 2.4 V and with a current of 0.1 mA. As may be noted, the bottom trace shows peaks that may be attributed to multiple counts linked to simultaneous detection, by the detector element 12, of NIR field, single photons emitted by the diodes of the array of the emitter element 11. These peaks appear randomly but cause emission of a non-negligible amount of light.

The testing system 10 thus confirms that, by working in Geiger mode, but not in linear mode, it is possible to detect emission of NIR field photons emitted by the emitter in SPLE mode.

Figure 7:
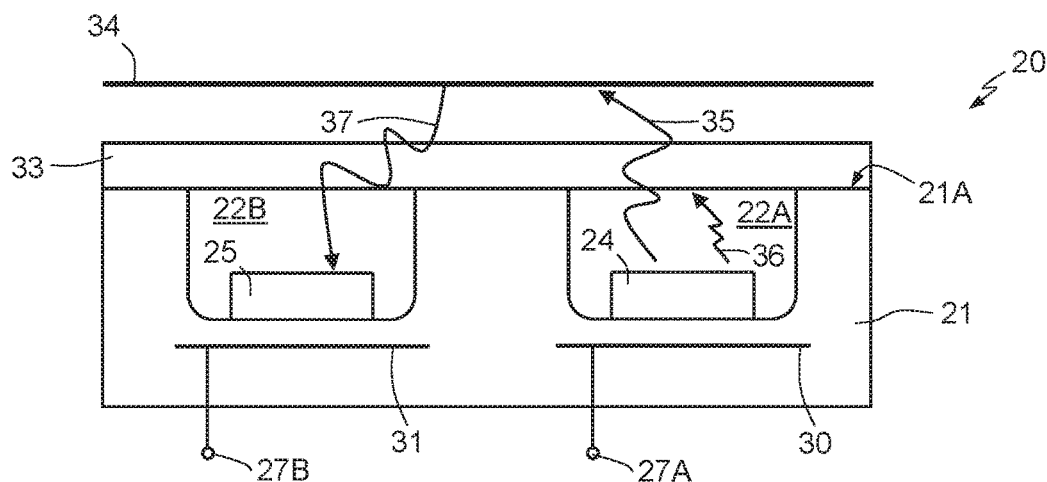
FIGS. 7-10 show different configurations of optical sensors according to various embodiments of the present sensor.

FIG. 7 shows an optical sensor 20 having a configuration in reflection mode.

The optical sensor 20 comprises a package 21, for example of blackened plastic material, such as PVC, polycarbonate, etc., adapted for optical applications. The package 21 has a first and a second cavity 22A, 22B, arranged side-by-side and extending from a same face 21A of the package 21. The first cavity 22A houses a light-emitter element 24; the second cavity houses a light-receiver element 25.

The light-emitter element 24 is an SPLE (Single-Photon Light Emitter) device, typically integrated in a chip. The SPLE device is of any material able to operate by single-photon emission, as described above; for example, it may be of SiC, GaN, AlGaN, and other wide band-gap materials with a band gap value higher than or equal to 2.3 eV, such as diamond. The SPLE device may also be formed by a laser based upon SPLE operation or by the device described hereinafter with reference to FIGS. 14-24.

The light-receiver element 25 is formed by an APD (Avalanche PhotoDiode) or by SPADs (Single-Photon Avalanche Diodes) as a single-pixel or in an array, even in the SiPM (Silicon PhotoMultiplier) mode, which absorbs/absorb light in the emission band of the light-emitter element 24.

The package 21 also accommodates control electronics, in particular, a control and power supply circuit 30 for and connected to the light-emitter element 24, and a power supply and reading circuit 31 for and connected to the light-receiver element 25. The circuits 24 and 26 are connected to the outside, for example, via connections 27A, 27B.

The cavities 22A and 22B may be closed at the top by a filter element 33, for example, a plate attached to the face 21A of the package 21. The filter element 33 is formed by a band-pass optical filter that blocks the visible light and passes only the light component in the emission band of the light-emitter element 24 (for example, in the infrared).

In use, a reflecting surface 34 is arranged looking toward the face 21A of the package 21. The reflecting surface 34 is typically arranged on the outside of the package 21. The reflecting surface 34 is formed by an object a property whereof is to be measured, and may be formed by a surface of an external object, an organic tissue, a mixture of gases, etc.

To carry out the measures, as indicated by the arrows, the light-emitter element 24 is supplied with a low d.c. voltage (for example, a voltage of between 2 and 3 V) and emits a single-photon light radiation 35 at a preset wavelength in the direction of the filter element 33. In particular, the single-photon light radiation 35 is emitted as packets of photons emitted randomly in time. Currently, the light-emitter element 24 emits photons or packets of photons (when formed as element array) at a rate of $10^6$ photons or packets of photons per second (i.e., it emits a photon/packet of photons per microsecond). The light-emitter element 24 moreover emits further light radiation 36 (typically in the visible) towards the filter element 33. The filter element 33 blocks this further light radiation 36 and passes the single-photon light radiation 35, which impinges upon and is reflected by the reflecting surface 34 as measure radiation 37. The filter element 33 receives the measure radiation 37 and outputs a signal that may be processed, as described in greater detail with reference to FIG. 11. Alternatively, the package 21 may accommodate the processing electronics and power supply sources and may output (for example, to a display and/or a more complex system) an already processed signal.

Figure 8:
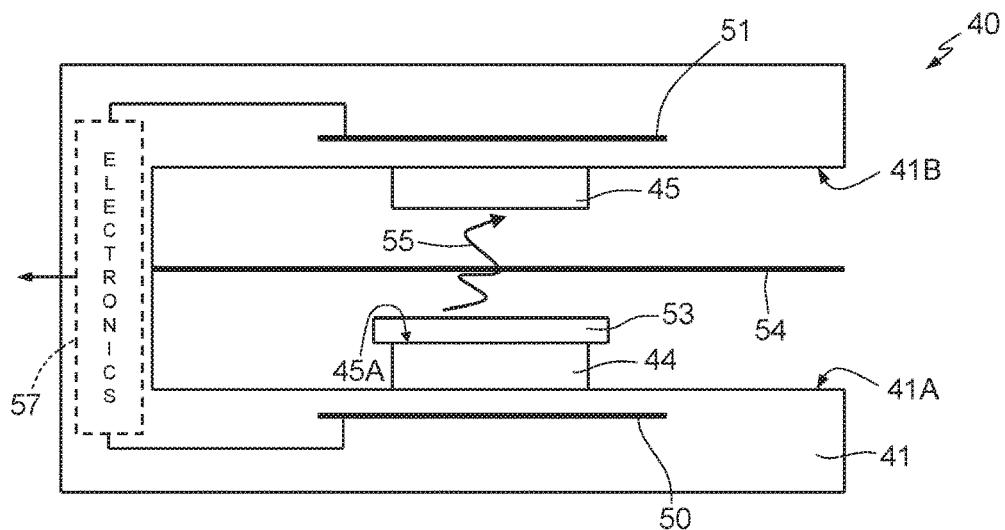

FIG. 8 shows an optical sensor 40 having a transmission-mode configuration. The optical sensor 40 comprises a package 41 having a C shape or some other shape and provided with two mutually facing supporting surfaces 41A and 41B. The supporting surfaces 41A and 41B carry, respectively, a light-emitter element 44 and a light-receiver element 45, thus also facing each other. The light-emitter element 44 and the light-receiver element 45 may be formed as described above for the corresponding elements 24 and 25 and are configured to emit and, respectively, to absorb a single-photon light radiation 55.

A filter element 53 (made like the corresponding filter element 33 of FIG. 7) is arranged between the light-emitter element 44 and the light-receiver element 45. Typically, the filter element 53 is arranged on or above the emitting surface 44A of the light-emitter element 44 (in contact therewith or at a short distance therefrom). Alternatively, the filter element 53 is arranged on or above the absorption surface 45A of the light-receiver element 45 (in contact therewith or at a short distance therefrom).

A control and power supply circuit 50 is housed in the package 41 underneath the light-emitter element 44 and is electrically connected to the latter as well as to a processing electronics 57 integrated in the package 41. A power supply and reading circuit 51 is housed in the package 41 underneath the light-receiver element 55 and is electrically connected to the latter as well as to the processing electronics 57.

Operation of the optical sensor 40 is similar to that of the optical sensor 20 described above. Here, a surface to be measured 54 is arranged between the light-emitter element 44 and the light-receiver element 45 and may be formed by a material opaque to light but transparent to the single-photon light radiation 55 and represents the object to be measured, for example, formed by an opaque object, an organic tissue, a mixture of gases, etc.

Figure 9:
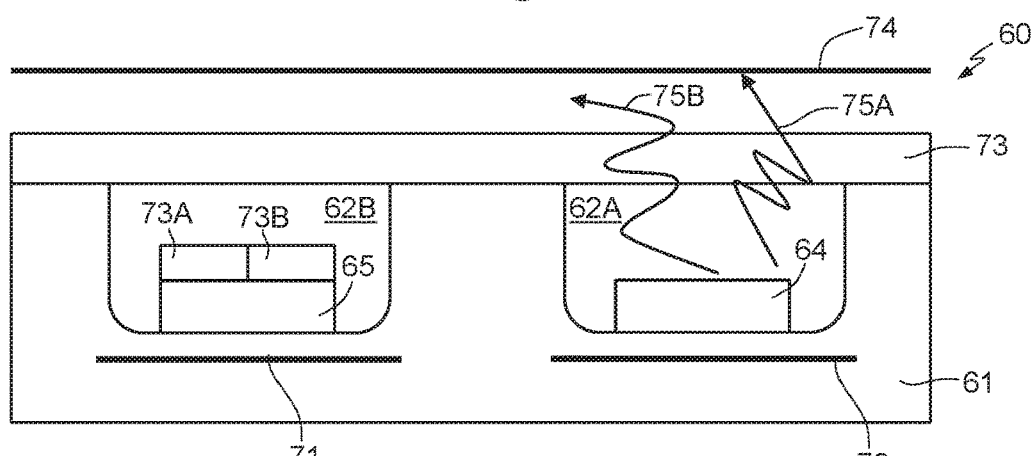

FIG. 9 shows an optical sensor 60 for operation with multiband LED sources in reflection configuration.

In detail, the optical sensor 60 of FIG. 9 comprises a package 61 similar to the package 21 of FIG. 7, having a first and a second cavity 62A 62B, respectively housing a light-emitter element 64 and a light-receiver element 65.

The light-emitter element 64 of FIG. 9 is an SPLE device of a hyperspectral type, typically integrated in a chip and configured to emit a single-photon light radiation at two distinct wavelengths. In FIG. 9, this radiation is indicated by two arrows 75A, 75B, representing each a photon or packet of photons having a respective, different wavelength. In particular, the light-emitter element 64 is of a material similar to the SPLE device of FIG. 7, wherein a controlled defectiveness has been provided, suitably obtained via irradiation of electrons or ions.

The light-receiver element 65 is formed by an APD or by SPADs of the single-pixel type or in arrays, similarly to the receiver element 25 of FIG. 7. Two receiving filters 73A, 73B are arranged above the light-receiver element 65. For example, the receiving filters 73A, 73B are absorption filters or micropatterned interferential filters, sensitive to light radiation at different wavelengths, corresponding to the wavelengths of the single-photon light radiation 75.

In the optical sensor 60 of FIG. 9, the cavities 62A and 62B are closed at the top by a transparent covering element 73, which ideally does not block light.

The package 61 also here houses a control and power supply circuit 70 and a power supply and reading circuit 71.

In use, a reflecting surface 74 is arranged facing the face 61A of the package 61, similarly to what described for the reflecting surface 54 of FIG. 7.

Figure 10:
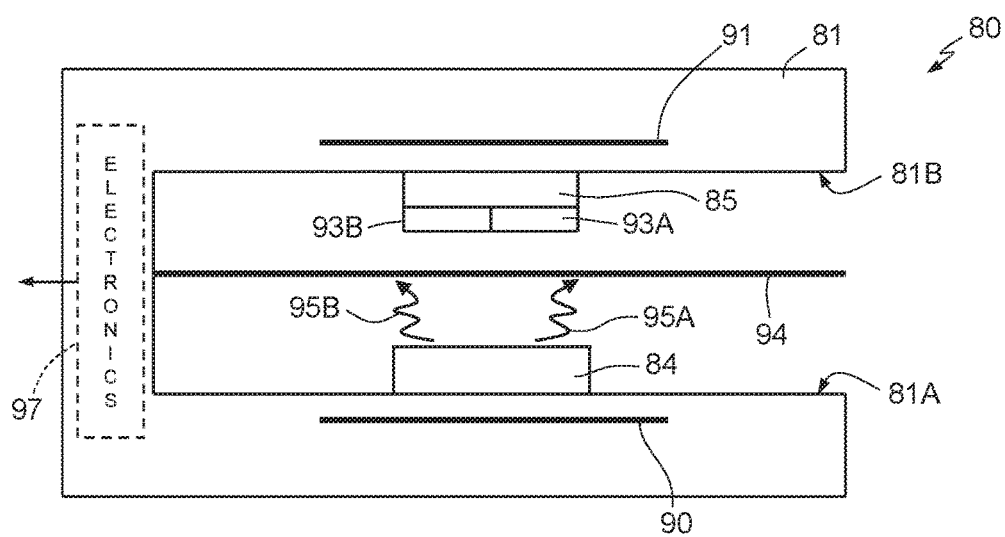

FIG. 10 shows an optical sensor 80 for operation with multiband LED source in transmission configuration.

In detail, the optical sensor 80 of FIG. 10 comprises a package 81 similar to the package 41 of FIG. 8. The package 81 also here is C-shaped and has two mutually facing supporting surfaces 81A and 81B. The supporting surfaces 81A and 81B carry, respectively, a light-emitter element 84 and a light-receiver element 85, facing each other. The light-emitter element 84 of FIG. 10 is similar to the light-emitter element 64 of FIG. 9 and is thus of a hyperspectral SPLE type, configured to emit a single-photon light radiation 95A, 95B at two distinct wavelengths.

The light-receiver element 85 of FIG. 10 is similar to the light-receiver element 65, thus may be formed by an APD or by SPADs and has two receiving filters 93A, 93B, similar to the receiving filters 73A, 73B of FIG. 9.

Similarly to FIG. 9, the receiving filters 93A, 93B are arranged on or above the light-receiver element 85 (in contact therewith or at a short distance therefrom).

A control and power supply circuit 90 is accommodated in the package 81 and is electrically coupled to the light-emitter element 84, as well as to a processing electronics 97 integrated in the package 81. A power supply and reading circuit 91 is housed in the package 81 and is electrically coupled to the light-receiver element 85, as well as to the processing electronics 97.

Also here, in use, a surface to be measured 94 is arranged between the light-emitter element 84 and the light-receiver element 85. Similar to the surface to be measured 54 of FIG. 8, the surface to be measured 94 may be a material opaque to light but transparent to the single-photon light radiation, here represented by two arrows 95A, 95B, each corresponding to a respective different wavelength.

FIG. 11A shows the structure of a proximity sensor 100 using the optical sensor of FIGS. 7-10. In this figure, some of the shown blocks may be integrated within the package of the optical sensor (for example, formed by the processing electronics 57, 97), may be integrated in one or more external integrated devices configured to carry out one or more management and control functions, or may form part of a more complex system, including a plurality of integrated devices and/or processing units, each having a specific function.

In detail, the proximity sensor 100 comprises an optical unit 101, which may be formed by the optical sensor 20, 40, 60, or 80 and thus comprises an SPLE light-emitter element 102, an SPAD/SiPM light-receiver element 103 and a power supply unit 104. The power supply unit 104 may, however, be external.

The output of the SPAD/SiPM light-receiver element 103 is connected to a filtering and amplification unit 107, in turn having an output connected to an analog-to-digital converter (ADC) 108.

A microcontroller 110 is connected to the optical sensor 101, and more precisely to the SPLE light-emitter element 102, to the filtering and amplification unit 107, and to an external device 111, for example a personal computer, a display, or a memory unit.

The SPLE light-emitter element 102 operates in forward biasing, for example, at a voltage of 2-3 V and a current of 100 µA-10 mA either in free-running mode or in gated mode, typically at a frequency of 50 Hz and with an activation time of 1-10 µs. In the former case, the SPLE light-emitter element 102 is activated by the microcontroller 110 so as to emit light in a random way. In the latter case, it is activated to emit light only in the envisaged ON intervals.

Also the SPAD/SiPM light-receiver element 103 can operate in free-running or gated condition. When it detects light (for example, reflected or transmitted by an object to be examined, according to one of the schemes shown in FIGS. 7-10), it generates an electrical signal. The electrical signal is filtered and amplified by the filtering and amplification unit 107 to reduce the electronic noise and possibly shift it to a level adapted for its subsequent processing.

The analog-to-digital converter (ADC) 108 detects the mean charge supplied by the SPAD/SiPM light-receiver element 103 within a fixed time interval. To this aim, it operates in charge-integration mode, for example, at a sampling frequency higher than 50 Hz and with a resolution of 14 bits, and supplies the digital signal thus obtained to the microcontroller 110. The latter, in addition to operating as timing-management unit for the SPLE light-emitter element 102, communicates with the analog-to-digital converter (ADC) 108 to control the sampling frequency and supplies the processed information to the external device 111, for example, via a USB unit.

FIG. 11B shows a variant of the proximity sensor 100, designated by 100', which can be used when the SPAD/SiPM light-receiver element 103 operates in Geiger mode. In this case, the analog-to-digital converter (ADC) 108 of FIG. 11A is replaced by a comparator 113 and by a counter 114, cascaded to each other. Here, the comparator works in continuous mode to detect the signals exceeding a preset threshold, for example (in the case of an SPAD/SiPM light-receiver element 103 of a multicell type) to count the detected photon packets, ignoring any single-photon detection. The counter 114 thus counts the number of photon packets received in a preset time interval (for example, under the control of the microcontroller 110) and supplies the count result to the latter.

FIGS. 12 and 13 show, respectively, the structure of an optical sensor 130 usable as a time-of-flight sensor and the configuration of the electronics associated thereto.

In FIG. 12, the optical sensor 130 comprises a package 131 having a first, a second and a third cavity 132A, 132B, 132C, arranged side-by-side to each other and extending from a same face 131A of the package 131. The first cavity 132A accommodates a light-emitter element 135; the second and third cavities 132B, 132C accommodate a reference light-receiver element 136R and a measure light-receiver element 136M, respectively.

The light-emitter element 135 is a SPLE device, typically integrated in a chip, of the type referred to above with reference to FIGS. 7-10.

The reference and measure light-receiver elements 136R, 136M are each formed by an APD or by SPAD arrays, of the type described above with reference to FIGS. 7-10. They typically have the same structure.

The package 131 also accommodates a control and power supply circuit 140 connected to the light-emitter element 135 and two power supply and reading circuits 141R, 141M connected, respectively, to the light-receiver elements 136R, 136M. The circuits 140, 141R, and 141M are connected to the outside, for example, via connections, not shown.

The cavities 132, 132B, 132C may be closed at the top by a filter element 144, for example formed as the filter element 33 of FIG. 7.

The time-of-flight sensor 130 further comprises a beam splitter 145, arranged above the light-emitter element 135, and an optical mirror 146.

The beam splitter 145 is arranged on the path of the light radiation 150 emitted by the light-emitter element 135 and is configured to transmit a first part thereof (transmitted portion 150A) towards a reflecting surface 155 and to reflect a second part thereof (reflected portion 150B) towards the optical mirror 146.

In turn, the optical mirror 146 is arranged to reflect the reflected portion 150B towards the reference light-receiver element 136R.

In use, the reflecting surface 145 (the distance or other characteristics whereof are to be measured through the time of flight) is arranged looking toward the face 131A of the package 131. Also here, the reflecting surface 145 may be formed by a surface of an external object, an organic tissue, a mixture of gases, etc.

To carry out measure, an electronics as shown in FIG. 13 may be used.

FIG. 13 shows a proximity sensor 180 in the configuration as time-of-flight measuring module.

The proximity sensor 180 comprises the optical sensor 130 of FIG. 12; a comparator 181; a time-to-amplitude converter 182; an analog-to-digital converter 183; and a processing unit 184. In FIG. 13, the power supply, control, and reading circuits 140, 141R, and 141M are represented by a single power supply block 185.

In particular, the comparator 181 may be a constant fraction discriminator (CFD), and is connected to the output of the measure light-receiver element 136M. The time-to-amplitude converter 182 is, for example, a counter having an activation input (START) and a de-activation input (STOP), connected, respectively, to the output of the reference light-receiver element 136R (from which the time-to-amplitude converter 182 receives an activation signal s1) and to the output of the comparator 181 (from which it receives a de-activation signal s2). The analog-to-digital converter 183 is connected to the output of the time-to-amplitude converter 182 and may be a simple 14-bit digitizer, and the processing unit 184 is connected to the output of the analog-to-digital converter 183 and may be formed by a microprocessor, a computer, or some other smart unit.

In use, the light-emitter element 135 is forward-biased in continuous mode. When it emits a photon or photon packet, this is detected both by the reference light-receiver element 136R, after reflection on the optical mirror 146, and by the measure light-receiver element 136M, after reflection on the reflecting surface 145.

Due to the short distance between the reference light-receiver element 136R and the light-emitter element 135, as well as the optical mirror 146, in general the path of the reflected portion 150B is shorter than the path of the transmitted portion 150A, and thus the reference light-receiver element 136R detects the reflected portion 150B before the measure light-receiver element 136M detects the transmitted portion 150A.

Consequently, also considering that the light radiation received by the measure and reference light-receiver elements (transmitted portion 150A and reflected portion 150B) have the same temporal characteristics, first the reference light-receiver element 136R detects the reflected portion 150B and generates the activation signal s1, which activates the time-to-amplitude converter 182, and then the measure light-receiver element 136M detects the transmitted portion 150A and generates the de-activation signal s2.

The time-to-amplitude converter 182 can thus output a signal s3 indicating the detection delay of the measure light-receiver element 136M with respect to the reference light-receiver element 136R. The processing unit 184 can thus derive the desired information regarding the reflecting surface 145, in a per se known manner.

The proximity sensor described with reference to FIGS. 7-13 has at least the following advantages:

very high sensitivity, since it can operate at level of a single photon with high efficiency even in very dark environments or on highly illuminated surfaces;

very low consumption levels, since SPLE operation has been demonstrated also with low power light sources (with a power as little as 50 µW), and at a distance of 10 cm from the illuminated object;

operation at room temperature, without any need for cooling to increase sensitivity;

optical configuration that may be used for standard proximity measures (measures of intensity changes of the light reflected by or transmitted through an object), with the light-emitter element biased in continuous or gated mode;

simplicity of the associated electronics in the time-of-flight measuring configuration, thanks to the light coherence in the SPLE devices and to the possibility of observing very fast signals with the light-emitter element biased in continuous mode that does not require a driving electronics that is very fast but very complex and with low performance;

possibility of using multiple-wavelength emission for hyperspectral analyses, without the need to use conversion phosphors with short lifetime of epoxy resin to produce a light emission at higher wavelengths;

high purity of the light signal (single photon) of the SPLE devices, useful in many applications; and possibility of implementing integrated structures adapted for improving the monochromaticity and the brightness of the light emission (for example, in VCSEL operating mode).

FIGS. 14-24 show manufacturing steps for a single-photon NIR-field light-emitter element, usable in the proximity sensor of FIGS. 7-13 or in other applications where is desired to increase light emission (even for applications not limited to the proximity sensor).

Figure 14:
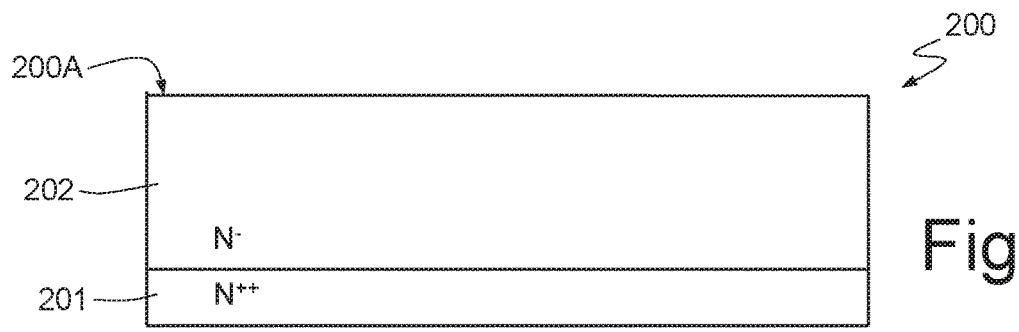
FIG. 14-21 are cross-sections of a photoemitter device usable in the embodiments of FIGS. 7-13 in successive manufacturing steps.

FIG. 14 shows a wafer 200 of a wide band-gap, solid-state material having a band-gap greater than or equal to 2.3 eV, here silicon carbide (SiC), comprising a substrate 201 of an $N^{++}$ type and an epitaxial layer 202 of an $N^{-}$ type. For example, the substrate 201 may be 4H—SiC with a thickness of 350 µm and a doping level of $1\times10^{19}$ at/cm$^3$ and the epitaxial layer 202 may have a thickness of 4 µm and a doping level of $1\times10^{14}$ at/cm$^3$. The epitaxial layer 202 forms a cathode region and a front surface 200A of the wafer 200.

Figure 15:
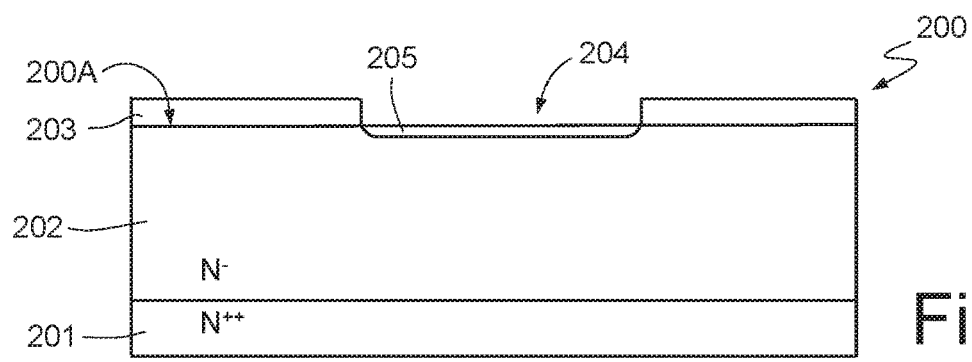

After usual initial steps for cleaning, forming zero-layer markers, etc., an anode mask 203 is deposited on the front surface 200A of the wafer 200 (FIG. 15). For example, the anode mask 203 may be a hard mask of TEOS (TetraEthyl Orthosilicate), deposited by PECVD (Plasma-Enhanced Chemical-Vapor Deposition) and defines an anode window 204.

Then, an anode implantation is carried out. For example, aluminum may be implanted at an energy of between 30 keV and 80 keV with a dose comprised between $5\times10^{13}$ cm$^{-2}$ and $1\times10^{14}$ cm$^{-2}$, at a temperature of approximately 400° C. A thin anode layer 205 is thus formed, under the anode window 204.

Figure 16:
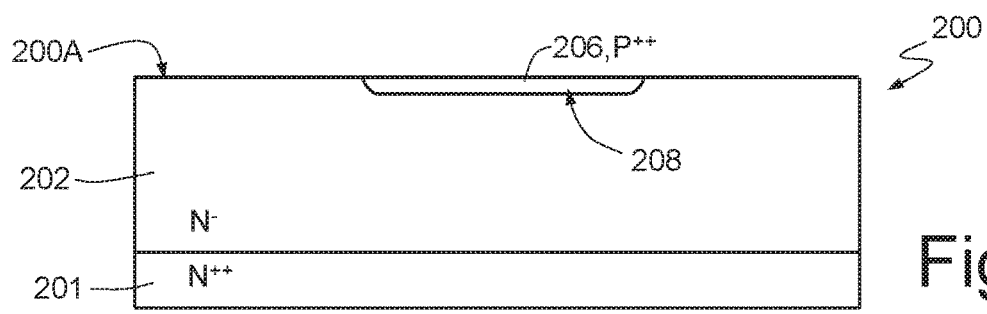
Figure 17:
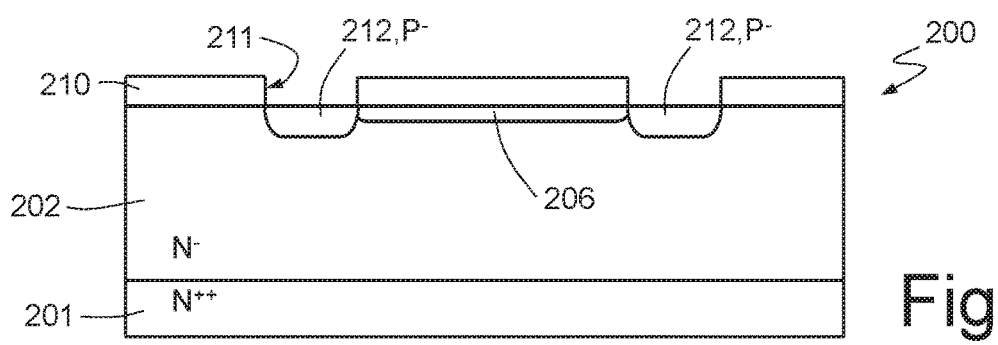

In FIG. 16, the anode mask 203 is removed by wet etch, the front surface 200A of the wafer 200 is covered with a protective layer (not shown) and an annealing step is carried out for activating the aluminum ions and to recover the implantation damage, for example at a temperature of 1650° C. for 30 min in argon environment. An anode region 206 of a $P^+$ type is thus formed, thus creating a junction 208 with the cathode region (epitaxial layer 202).

After removing the protective layer (FIG. 17), a ring mask 210 is deposited. The ring mask 210 is, for example, a hard mask of TEOS (TetraEthyl Orthosilicate), deposited by PECVD (Plasma-Enhanced Chemical Vapour Deposition), having a ring window 211. The ring window 211 has an annular shape and surrounds the anode region 206.

Next, a ring implantation is carried out, for example, with boron or aluminum. When boron is implanted, it is possible to use an energy comprised between 30 keV and 80 keV and a dose comprised between $8 \times 10^{14}$ cm$^{-2}$ and $1.2 \times 10^{15}$ cm$^{-2}$, with rapid treatment (RT). A thin ring layer 212 is thus formed, below the ring window 211.

Figure 18:
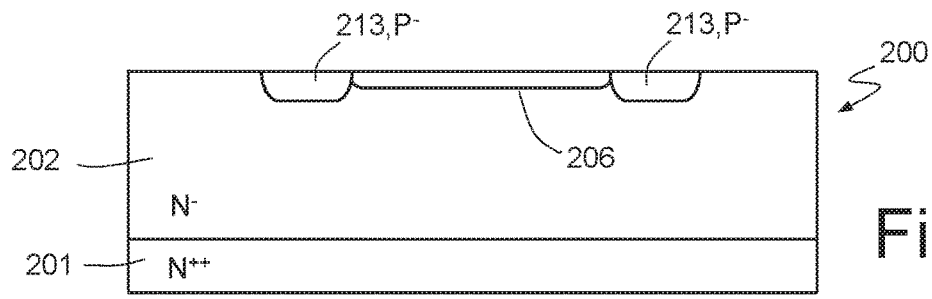

Annealing is then carried out for reducing implantation defects. For example, the treatment is carried out at a temperature of approximately 1050° C. for 90 min in oxidizing environment. Then, the ring mask 210 is removed. The structure of FIG. 18 is thus obtained, wherein a ring region 213 of a $P^-$ type extends around and contiguous to the anode region 206.

Figure 19:
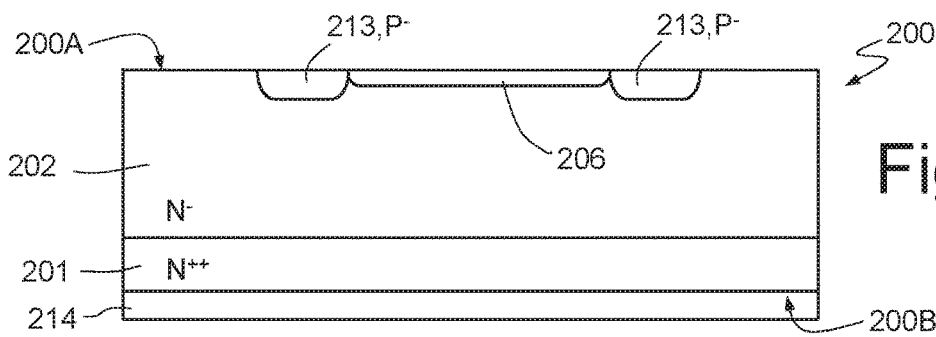

Next, FIG. 19, the front surface 200A of the wafer 200 is again covered with a protective layer (not shown), for example of resist or TEOS, and a cathode-contact region 214 is formed on the rear surface 200B of the wafer 200. For instance, first nickel is deposited by sputtering; then, the protective layer (not shown) on the front surface 200A of the wafer 200 is removed, and a rapid thermal annealing (RTA) is carried out, forming the cathode-contact region 214.

Figure 20:
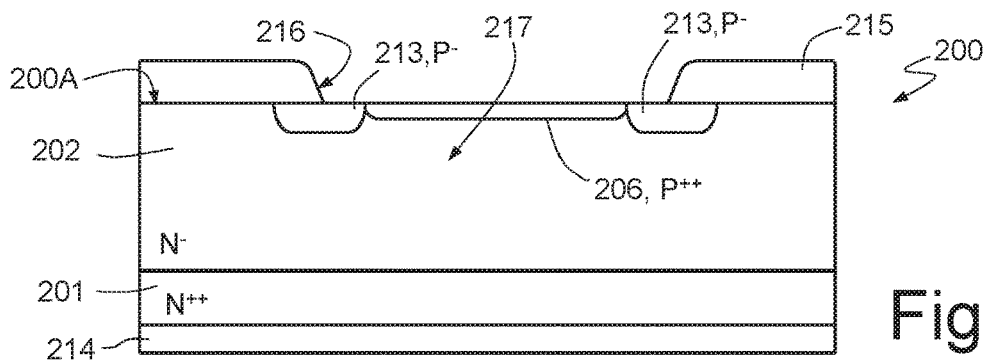

Next, FIG. 20, a field-oxide layer 215 is grown on the front surface 200A of the wafer 200, in a per se known manner. The field-oxide layer 215 has a window 216 above the anode region 206 and most of the ring region 213, and thus delimits an active area 217 within the wafer 200.

Figure 21:
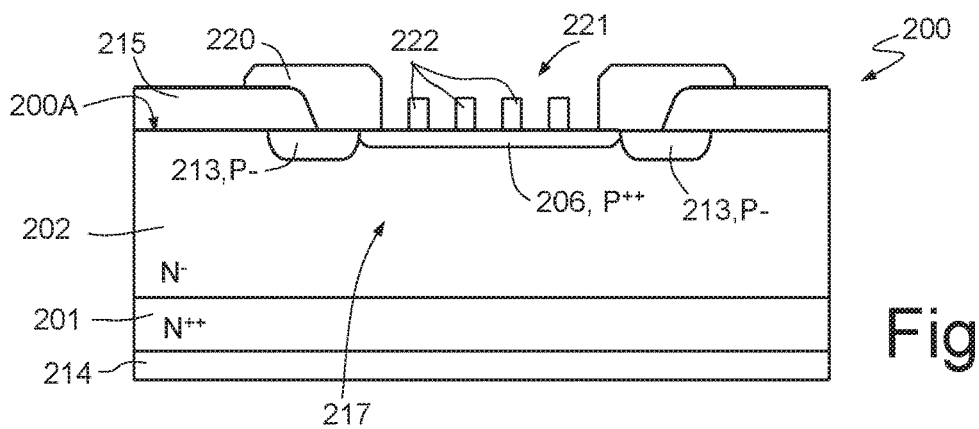
Figure 22:
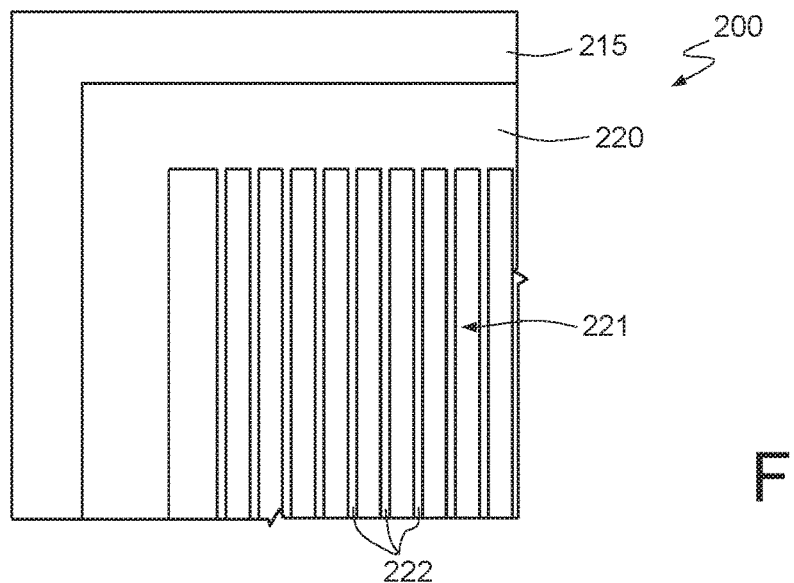
FIG. 22 is a top plan view of a portion of the photoemitter device of FIG. 19.

Then, FIG. 21, an anode-contact region 220 and a potential-distribution region 221 are formed simultaneously. For instance, a metal layer, for example of nickel, with a thickness of approximately 200 nm, is deposited by sputtering on the front surface 200A of the wafer 200, the metal layer is selectively removed using a suitable mask, for example by wet etch, and a thermal treatment is carried out, for example a rapid thermal annealing (RTA) at 650° C. for 60 s in nitrogen environment to promote the nickel silicide formation.

Thereby, as shown in the top plan view of FIG. 21 representing approximately one quarter of the structure, the anode-contact region 220 has an annular shape extending along the edge of the window 216 of the field-oxide layer 215, over the field-oxide layer 215, in direct electrical contact with the annular region 213 and part of the anode region 206.

Moreover, as also shown in the top plan view of FIG. 21, the potential-distribution region 221 is formed by a grid of potential-distribution portions 222 extending over the entire surface of the anode region 206. The potential-distribution portions 222 are in electrical contact with each other and with the anode-contact region 220; moreover, they are contiguous and in direct electrical contact with the anode region 206. The potential distribution portions 222 extend regularly over this surface, at a constant distance from each other. In the embodiment of FIG. 21, the potential-distribution portions 222 are formed by strips parallel to each other. In this case, according to an embodiment, the potential-distribution portions 222 may have a width comprised between 1 and 3 μm and may be at a mutual distance of 4-10 μm. According to a different embodiment, the potential-distribution portions 222 may form a mesh, for example, a square mesh, with portions intersecting each other in transverse direction. However, the shape of the potential-distribution region 221 may also vary, provided that it enables photon emission and reduces the resistive drops between the anode-contact region 220 and the central part of the anode region 206.

Figure 23:
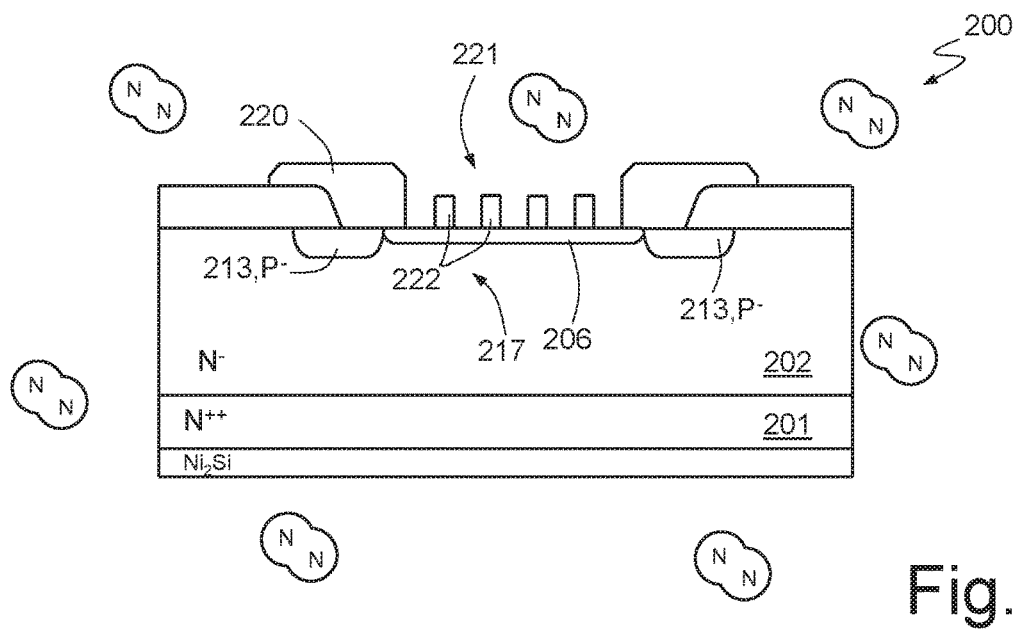
FIGS. 23-24 are cross-sections of the photoemitter device of FIGS. 14-19 in further manufacturing steps.

Then, FIG. 23, a thermal annealing is carried out in nitrogen environment, in a temperature range comprised between 400° C. and 600° C., for a time of 30-180 min. This treatment, compatible with the previous manufacturing steps, induces defects in the active area 217, where emission of light radiation occurs.

Figure 24:
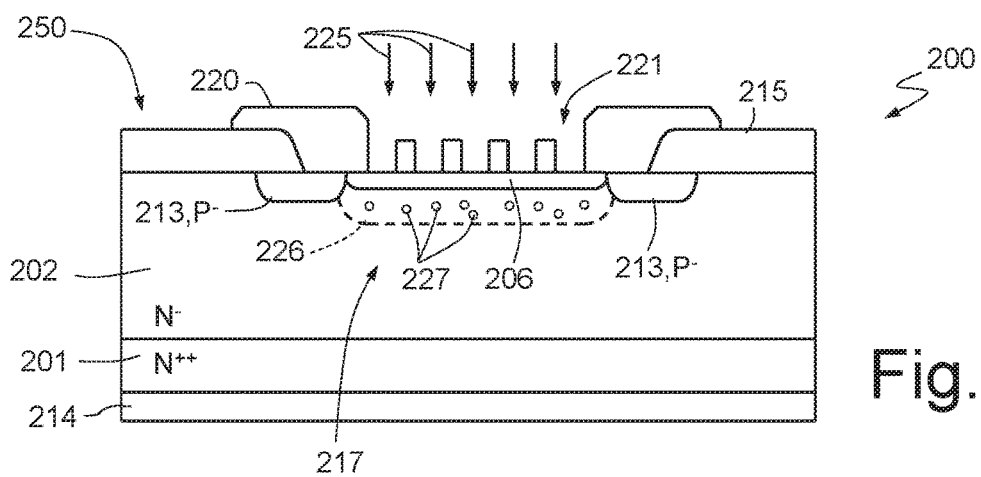

Next, FIG. 24, an ion implantation is carried out to introduce further defects in the active area 217, as represented schematically by the arrows 225. The implantation 225 is carried out with doses and energy such as to have the peak of implanted atoms in the portion of the active area 217 arranged under the anode region (depleted area 226, where the implanted atoms are designated by 227). The implantation is carried out with ions of atoms belonging to Group IV or VIII of the periodic table, so as not to modify the conductivity of the anode region 206. For example, ions of carbon (C), silicon (Si), helium (He), argon (Ar), or neon (Ne) may be implanted. Implantation of carbon may, for example, be carried out with a dose of $10^{11}$-$10^{13}$ cm$^{-2}$, and an energy of 90-200 keV; implantation of silicon may, for example, be carried out with a dose of $10^{11}$-$10^{13}$ cm$^{-2}$, and an energy of 200-400 keV; implantation of helium may, for example, be carried out with a dose of $10^{12}$-$10^{14}$ cm$^{-2}$, and an energy of 30-80 keV; implantation of argon may, for example, be carried out with a dose of $10^{12}$-$10^{14}$ cm$^{-2}$, and an energy of 200-400 keV; and implantation of neon may, for example, be carried out with a dose of $10^{11}$-$10^{13}$ cm$^{-2}$, and an energy of 150-250 keV.

In this way, in the depleted area 226 a peak defective area is formed (silicon vacancies in the crystalline structure) adjacent and contiguous to the junction and due to the concentration of non-bound atoms of Group IV or VIII. For example, the silicon vacancies in the peak defectiveness area 226 may have a concentration of at least $10^{13}$ atoms/cm$^{-3}$, higher than mean values of silicon vacancies in the anode region 206 and in the epitaxial layer 202.

Then final manufacturing steps follow, including dicing the wafer 200, to obtain a plurality of light-emitting devices 250.

Figure 25:
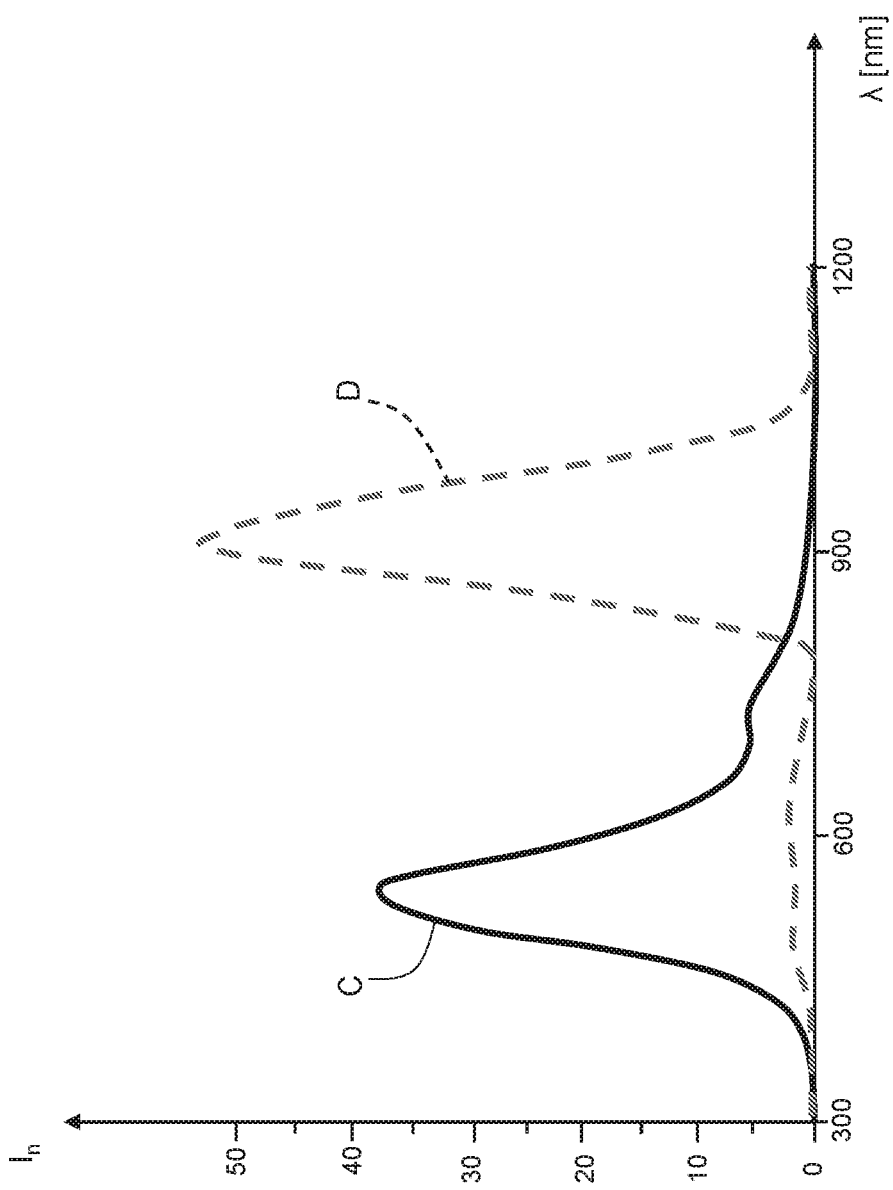
FIG. 25 shows electroluminescence spectra obtained with a photoemitter device formed according to FIGS. 14-24.

The light-emitting devices 250 provide an increase of the NIR-field emission efficiency, as may be seen in FIG. 25 showing electroluminescence spectra representing the intensity In (measured in arbitrary units) as a function of the wavelength λ (measures carried out at a fixed current of 2 mA) respectively for a virgin diode (curve C) and for a diode manufactured according to the description of FIGS. 19-24 and irradiated with helium He at 40 keV (curve D).

As may be noted from these figures, the presence of silicon vacancies due to non-bound atoms of Group IV or VIII, neutral with respect to the doping of the epitaxial region 202 and of the anode region 206, in the peak defectiveness area (depleted region 226), has proven experimentally to be extremely effective in increasing the NIR-field emission efficiency, at the same time turning off emission in the visible light range, typical of silicon-carbide devices. The described thermal processes in nitrogen atmosphere at low temperature also contribute thereto.

The light-emitter device 250 may be integrated in a single chip with signal applying and processing structures also because the process modifications may be easily integrated and do not induce any significant degradation in the performance of the device.

Moreover, the presence of the potential-distribution region 221 on the surface of the anode region 206 considerably reduces the resistive drops between the anode-contact region 220 and the central area of the light-emitter device 250, due to the high resistance of the anode region 206. In fact, as is known to the person skilled in the art, the material of the light-emitter device 250 (SiC) causes activation of the dopant atoms to be difficult, even at very high process temperatures, higher than 1650° C. Consequently, even when high dopant doses are implanted, the activated fraction is relatively low and the anode region 206 has a quite high resistance, which would cause a voltage drop between the anode-contact region 210 (representing the current collection point) and the center of the light-emitter device 250. This voltage drop would cause turning-on only of an annular area in proximity of the anode-contact region 210 of the light-emitter device 250. The potential-distribution region 221 reduces this phenomenon, creating a mesh of contacts at the same potential on the active area 217 of the light-emitter device 250. Although the potential-distribution region 221 reduces also the light radiation emission area, the obtainable gain due to the uniform emission over the entire active area of the device 250 overrides the negative effect due to the reduction of active area. In practice, this allows to prevent the need to implant the anode region 206 at very high doses and thus generation of excessive damage to the junction between the anode region 206 and the epitaxial layer 202.

Finally, it is clear that modifications and variations may be made to the optical sensor and to the manufacturing method described and illustrated herein, without thereby departing from the scope of the present disclosure. For example, the described various embodiments may be combined so as to provide further solutions.

Moreover, the wafer 200, in particular the epitaxial layer 202, may be any solid-state material of the wide-band-gap type, such as gallium nitride (AlGaN), or diamond.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An optical sensor, comprising:
a body of solid-state material with a band gap greater than or equal to 2.3 eV, the body having a surface; and
a light-emitter device in the body, the light-emitter device including:
a cathode region having a first conductivity type; and
an anode region having a second conductivity type and extending into the cathode region from the surface of the body, the anode region and the cathode region defining a junction,
wherein the cathode region has, adjacent to the junction, a peak defectiveness area housing vacancies in a crystalline structure due to non-bound ions or atoms of Group IV or VIII of the periodic table, and
wherein the vacancies in the peak defectiveness area have a concentration of at least $10^{13}$ atoms/cm$^{-3}$.

2. The optical sensor according to claim 1, wherein the solid-state material is silicon carbide.

3. The optical sensor according to claim 1, wherein the non-bound ions or atoms include at least one of carbon, silicon, helium, neon, or argon.

4. The optical sensor according to claim 1, wherein a concentration of the vacancies in the peak defectiveness area is higher than a mean concentration of vacancies in the anode region and in the cathode region.

5. The optical sensor according to claim 1, further comprising:
an anode electrode on the surface of the body and on at least a periphery of, and in electrical contact with, the anode region; and
a potential-distribution region electrically coupled to the anode electrode, the potential-distribution region including an electrically conductive material on the surface of the body, laterally surrounded by the anode electrode, and partially covering the anode region.

6. The optical sensor according to claim 5, wherein the anode electrode and the potential-distribution region are formed of a same metal material.

7. The optical sensor according to claim 5, wherein the potential-distribution region includes a plurality of electrically conductive portions forming a grid or a structure with adjacent strips.

8. The optical sensor according to claim 1, wherein the light-emitter device is a single-photon light-emitter element configured to emit a single-photon emission radiation having a wavelength within a first wavelength range, wherein the optical sensor further comprises a light-receiver element configured to operate in avalanche operating mode or in photomultiplier operating mode and arranged, in use, to receive, directly or via reflection, radiation emitted from the light-emitter device.

9. The optical sensor according to claim 8, comprising a long-pass filter having a pass band corresponding to the first wavelength range and facing at least one of the single-photon light-emitter element or the light-receiver element.

10. The optical sensor according to claim 8, comprising an opaque package having a face, a first cavity and a second cavity, which extend from the face of the package, wherein the first cavity houses the single-photon light-emitter element and the second cavity houses the light-receiver element.

11. The optical sensor according to claim 8, comprising an opaque package having a first load-bearing surface and a second load-bearing surface facing each other, the first load-bearing surface carrying the single-photon light-emitter element and the second load-bearing surface carrying the light-receiver element.

12. The optical sensor according to claim 8, wherein the light-emitter device is a hyperspectral light-emitter element configured to emit light radiation in at least two distinct emission wavelength ranges, and the light-receiver element includes a plurality of photodiodes of avalanche or photomultiplier type, each of the photodiodes associated with a respective filter configured to transmit light at respective wavelength ranges corresponding to the emission wavelength ranges.

13. The optical sensor according to claim 8, comprising a first power supply electrically coupled to the single-photon light-emitter element and configured to supply a forward d.c.

supply voltage, and a second power supply electrically coupled to the light-receiver element and configured to supply a reverse d.c. supply voltage.

14. An optical proximity sensor, comprising:
a body of solid-state material with a band gap greater than or equal to 2.3 eV, the body having a surface;
a light-emitter device in the body, the light-emitter device including:
a cathode region having a first conductivity type; and
an anode region having a second conductivity type and extending into the cathode region from the surface of the body, the anode region and the cathode region defining a junction,
wherein the cathode region has, adjacent to the junction, a peak defectiveness area housing vacancies in a crystalline structure due to non-bound ions or atoms of Group IV or VIII of the periodic table,
wherein the light-emitter device is a single-photon light-emitter element configured to emit a single-photon emission radiation having a wavelength within a first wavelength range;
a light-receiver element configured to operate in avalanche operating mode or in photomultiplier operating mode and arranged, in use, to receive, directly or via reflection, radiation emitted from the light-emitter device; and
a current-pulse counting stage configured to count current pulses supplied by the light-receiver element.

15. The optical proximity sensor according to claim 14, comprising:
an opaque package carrying the single-photon light-emitter element, the light-receiver element, and a reference receiver element, the reference receiver element being a photodiode configured to operate as a single-photon avalanche diode or a silicon photomultiplier;
an optical beam splitter facing the single-photon light-emitter element and configured to receive the single-photon emission radiation and generate a first radiation fraction and a second radiation fraction;
a first optical path, between the optical beam splitter and the reference receiver element, configured to transmit the first radiation fraction towards the reference receiver element, wherein the reference receiver element is configured to generate a reference signal upon detection of the first radiation fraction;
a second optical path between the optical beam splitter and the light-receiver element, configured to transmit the second radiation fraction towards the light-receiver element, after reflection on an object to be measured, wherein the light-receiver element is configured to generate a measure signal upon detection of the second radiation fraction; and
a time-to-amplitude converter configured to receive the reference signal and the measure signal and generate a time-of-flight signal correlated to a time elapsed between reception of the reference signal and reception of the measure signal.

16. The optical proximity sensor according to claim 15, wherein the first optical path comprises an optical mirror configured to receive the first radiation fraction and reflect it towards the reference receiver element.

17. The optical proximity sensor according to claim 15, comprising a power supply configured to d.c. forward bias the reference receiver element.

18. A device, comprising:
a body having a surface; and
a light-emitter device in the body, the light-emitter device configured to emit a single-photon emission radiation having a wavelength within a first wavelength range, the light-emitter device including:
a cathode region having a first conductivity type; and
an anode region having a second conductivity type and extending into the cathode region from the surface of the body, the anode region and the cathode region defining a junction,
wherein the cathode region has, adjacent to the junction, a peak defectiveness area housing vacancies in a crystalline structure due to non-bound ions or atoms of Group IV or VIII of the periodic table, and the vacancies in the peak defectiveness area have a concentration of at least $10^{13}$ atoms/cm$^{-3}$; and
a light-receiver element configured to receive, directly or via reflection, radiation emitted from the light-emitter device.

19. The device of claim 18, wherein the non-bound ions or atoms include at least one of carbon, silicon, helium, neon, or argon, and
a concentration of the vacancies in the peak defectiveness area is higher than a mean concentration of vacancies in the anode region and in the cathode region.

20. The device of claim 18, further comprising a current-pulse counting stage configured to count current pulses supplied by the light-receiver element.

21. The device of claim 18, further comprising:
an anode electrode on the surface of the body and on at least a periphery of, and in electrical contact with, the anode region; and
a potential-distribution region electrically coupled to the anode electrode, the potential-distribution region including an electrically conductive material on the surface of the body, laterally surrounded by the anode electrode, and partially covering the anode region.

22. The device of claim 21, wherein the anode electrode and the potential-distribution region are formed of a same metal material.

23. The device of claim 21, wherein the potential-distribution region includes a plurality of electrically conductive portions forming a grid or a structure with adjacent strips.

24. The optical proximity sensor of claim 14, wherein the vacancies in the peak defectiveness area have a concentration of at least $10^{13}$ atoms/cm$^{-3}$.

* * * * *